(12) United States Patent
Tam et al.

(10) Patent No.: US 10,581,478 B1
(45) Date of Patent: Mar. 3, 2020

(54) RADIO-FREQUENCY FRONT END WITH POWER AMPLIFIER DETUNING TO REDUCE OUTPUT DEGRADATION

(71) Applicant: Marvell International Ltd., Hamilton (BM)

(72) Inventors: Sai-Wang Tam, Sunnyvale, CA (US); Randy Tsang, San Carlos, CA (US); Ovidiu Carnu, Scotts Valley, CA (US); Donghong Cui, San Jose, CA (US); Amir Ghaffari, Campbell, CA (US); Wai Lau, San Jose, CA (US); Timothy Loo, San Jose, CA (US); Alden C. Wong, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/274,529

(22) Filed: Feb. 13, 2019

Related U.S. Application Data (60) Provisional application No. 62/631,307, filed on Feb. 15, 2018.

(51) Int. Cl.
*H03F 3/191* (2006.01)
*H04B 1/18* (2006.01)
*H04B 1/04* (2006.01)

(52) U.S. Cl.
CPC ............. *H04B 1/18* (2013.01); *H03F 3/191* (2013.01); *H04B 1/0458* (2013.01); *H03F 2200/294* (2013.01); *H03F 2203/45048* (2013.01); *H03F 2203/7236* (2013.01); *H04B 2001/0416* (2013.01)

(58) Field of Classification Search
CPC ................................ H04B 1/18; H04B 1/0458
See application file for complete search history.

(56) References Cited

U.S. PATENT DOCUMENTS

| 7,340,235 | B1 * | 3/2008 | Madsen | ................ H03F 1/0205 330/254 |
| 9,780,817 | B2 * | 10/2017 | Scott | ....................... H03F 1/565 |

* cited by examiner

*Primary Examiner* — Tuan H Nguyen (57) ABSTRACT

Radio-frequency front-end circuitry includes an output terminal, a receive amplifier controllably coupled to the output terminal, at least one transmit amplifier controllably inductively coupled to the output terminal, and at least one impedance element controllably coupled between ground and one of the at least one transmit amplifier to reduce degradation of output of the radio-frequency front-end circuitry when the at least one transmit amplifier is not in use. In differential signaling, there is an impedance element between ground and each pole of the differential signal. A second transmit amplifier may generate second transmit signals and harmonics of the second transmit signals, and the second transmit amplifier may be switchably connected to the output of a first transmit amplifier so that output of the second transmit amplifier is filtered by the one of the first transmit amplifier. The transmit amplifiers may include a WiFi power amplifier and a BLUETOOTH® power amplifier.

21 Claims, 7 Drawing Sheets

RADIO-FREQUENCY FRONT END WITH POWER AMPLIFIER DETUNING TO REDUCE OUTPUT DEGRADATION

CROSS REFERENCE TO RELATED APPLICATION

This disclosure claims the benefit of copending, commonly-assigned U.S. Provisional Patent Application No. 62/631,307, filed Feb. 15, 2018, which is hereby incorporated by reference herein in its entirety.

FIELD OF USE

This disclosure relates to radio-frequency front-end circuitry in which a receiver and at least one transmitter share a connection to an external load, such as an antenna. More particularly, this disclosure relates to such radio-frequency front-end circuitry in which a transmitter power amplifier is controllably detuned to reduce signal degradation.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

In integrated radio-frequency front-end circuitry, a receiver and at least one transmitter share a connection to an external load, such as an input/output pad to an antenna. For example, certain types of radio-frequency communications devices may include a receiver, as well as a transmitter operating under the IEEE 802.11 standard, commonly referred to as "wireless fidelity," or WiFi. Some such devices may also include a transmitter for a short-range wireless system licensed by the Bluetooth Special Interest Group under the trademark BLUETOOTH®. The last stage of each transmitter includes a power amplifier. The presence of the WiFi power amplifier, even when not in use, can degrade the output of the receiver or the BLUETOOTH® transmitter.

SUMMARY

A method, according to implementations of the subject matter of this disclosure, of operating radio-frequency front-end circuitry, having an output terminal, a receive amplifier controllably coupled to the output terminal, and at least one transmit amplifier controllably inductively coupled to the output terminal, includes, during receive mode, switching at least one impedance element, having a first impedance value, into the radio-frequency front-end circuitry between ground and one of the at least one transmit amplifier to reduce degradation of output of the receive amplifier, and during transmit mode, switching the at least one impedance element at least partially out of the radio-frequency front-end circuitry.

In a first such implementation, where output of the one of the at least one transmit amplifier is controllably inductively coupled to the output terminal through a balun having a second impedance value, and the one of the at least one transmit amplifier has a resonant frequency, during receive mode, the switching into the radio-frequency front-end circuitry the at least one impedance element between ground and the one of the at least one transmit amplifier, to reduce degradation of output of the receive amplifier, changes the resonant frequency of the one of the at least one transmit amplifier to reduce noise at the receive amplifier.

In that first implementation, the switching at least one impedance element, having the first impedance value, into the radio-frequency front-end circuitry between ground and one of the at least one transmit amplifier may include switching, into the radio-frequency front-end circuitry, an impedance element of which the first impedance value is substantially equal to the second impedance value. In a variant of that implementation, the first impedance value is equal to the second impedance value.

In that first implementation, where the one of the at least one transmit amplifier uses differential signaling, having a first differential signal component with a first polarity and a second differential component with a second polarity opposite the first polarity, the switching at least one impedance element, having a first impedance value, into the radio-frequency front-end circuitry between ground and one of the at least one transmit amplifier may include switching, into the radio-frequency front-end circuitry, two impedance elements, each having the first impedance value which is substantially equal to the second impedance value, including switching a first one of the two impedance elements into the radio-frequency front-end circuitry between the first differential signal component and ground, and switching a second one of the two impedance elements into the radio-frequency front-end circuitry between the second differential signal component and ground. In a variant of that implementation, the first impedance value is equal to the second impedance value.

That first implementation, where the at least one transmit amplifier includes a second transmit amplifier that generates second transmit signals and harmonics of the second transmit signals and is controllably inductively connected to the output of the one of the at least one transmit amplifier, may further include filtering output of the second transmit amplifier by controllably inductively connecting the output of the second transmit amplifier to the output of the one of the at least one transmit amplifier, and switching the at least one impedance element out of the radio-frequency front-end circuitry so that the one of the at least one transmit amplifier acts as a filter of the output of the second transmit amplifier.

Radio-frequency front-end circuitry according to implementations of the subject matter of this disclosure includes an output terminal, a receive amplifier controllably coupled to the output terminal, at least one transmit amplifier controllably inductively coupled to the output terminal, at least one impedance element having a first impedance value and being controllably coupled between ground and one of the at least one transmit amplifier to reduce degradation of output of the radio-frequency front-end circuitry when the one of the at least one transmit amplifier is not in use, and control circuitry that actuates the controllable coupling of the receive amplifier to the output terminal, the controllable coupling of the transmit amplifier to the output terminal, and the controllable coupling of the at least one impedance element between ground and the one of the at least one transmit amplifier.

In a first implementation of such radio-frequency front-end circuitry, output of the one of the at least one transmit amplifier may be coupled to the output terminal through a balun having a second impedance value, the one of the at least one transmit amplifier having a resonant frequency, and coupling the at least one impedance element between ground and the one of the at least one transmit amplifier changes the resonant frequency of the one of the at least one transmit amplifier to reduce noise at the receive amplifier. In such an implementation, the first impedance value is substantially equal to the second impedance value. In a variant of that implementation, the first impedance value may be equal to the second impedance value.

In that first implementation of radio-frequency front-end circuitry, the one of the at least one transmit amplifier may use differential signaling, having a first differential signal component with a first polarity and a second differential signal component with a second polarity opposite the first polarity, the at least one impedance element may include two impedance elements, each having the first impedance value, a first one of the two impedance elements may be controllably coupled between the first differential signal component and ground, a second one of the two impedance elements may be controllably coupled between the second differential signal component and ground, and the first impedance value may be substantially equal to the second impedance value. In a variant of that implementation, the first impedance value may be equal to the second impedance value.

In that first implementation of radio-frequency front-end circuitry, the one of the at least one transmit amplifier may include a WiFi power amplifier.

In a variant of that first implementation of radio-frequency front-end circuitry, the at least one transmit amplifier may further include a second transmit amplifier that generates second transmit signals and harmonics of the second transmit signals, and the second transmit amplifier may be switchably connected to the output of the one of the at least one transmit amplifier so that output of the second transmit amplifier is filtered by the one of the at least one transmit amplifier. The second transmit amplifier may include a BLUETOOTH® power amplifier.

In that first implementation of radio-frequency front-end circuitry, each of the at least one impedance element may include a capacitor.

Combined WiFi/BLUETOOTH® transmitter/receiver front-end circuitry according to implementations of the subject matter of this disclosure includes an output terminal, an antenna coupled to the output terminal, a low-noise amplifier having an input coupled to the output terminal, a receiver bypass switch between the input of the low-noise amplifier and ground, a WiFi power amplifier having a differential output coupled to the output terminal through a balun having a first impedance, respective first and second selection impedances coupled via respective selection switches between ground and respective conductors of the differential output, a radio-frequency transmit switch between the balun and the output terminal, a BLUETOOTH® power amplifier having an additional output coupled to the balun, and an additional transmit switch between the additional output and ground. In a receive mode, the receiver bypass switch and the radio-frequency transmit switch are both open, and the additional transmit switch is closed, in a WiFi transmit mode, the receiver bypass switch, the radio-frequency transmit switch and the additional transmit switch are all closed, and the respective selection switches are both at most partially ON to tune the WiFi power amplifier to a desired frequency, and in a BLUETOOTH® transmit mode, the receiver bypass switch and the radio-frequency transmit switch are both closed, the additional transmit switch is open, and the respective selection switches are both open so that the WiFi power amplifier operates to filter harmonics from the additional output.

A method, in accordance with implementations of the subject matter of this disclosure, of operating combined WiFi/BLUETOOTH® transmitter/receiver front-end circuitry, having an output terminal, an antenna coupled to the output terminal, a low-noise amplifier having an input coupled to the output terminal, a receiver bypass switch between the input of the low-noise amplifier and ground, a WiFi power amplifier having a differential output coupled to the output terminal through a balun having a first impedance, respective first and second selection impedances coupled via respective selection switches between ground and respective conductors of the differential output, a radio-frequency transmit switch between the balun and the output terminal, a BLUETOOTH® power amplifier having an additional output coupled to the balun, and an additional transmit switch between the additional output and ground, includes selecting a receive mode by opening the receiver bypass switch to keep the low-noise amplifier in the circuitry, closing the additional transmit switch to remove the BLUETOOTH® power amplifier from the circuitry, opening the radio-frequency transmit switch to reduce coupling between the WiFi power amplifier and the output terminal, and turning both of the respective selection switches fully ON to detune the WiFi power amplifier from an operating frequency of the low-noise amplifier.

A first implementation of a method in accordance with implementations of the subject matter of this disclosure may further include selecting a WiFi transmit mode by closing the receiver bypass switch to remove the low-noise amplifier from the circuitry, closing the additional transmit switch to remove the BLUETOOTH® power amplifier from the circuitry, closing the radio-frequency transmit switch to fully couple the balun of the WiFi power amplifier to the output terminal, and turning both of the respective selection switches at most partially ON to tune the WiFi power amplifier to a desired frequency.

A variant of such an implementation may further include selecting a BLUETOOTH® transmit mode by closing the receiver bypass switch to remove the low-noise amplifier from the circuitry, opening the additional transmit switch to keep the BLUETOOTH® power amplifier in the circuitry, closing the radio-frequency transmit switch to fully couple the additional output of the BLUETOOTH® power amplifier to the output terminal through the balun, and turning both of the respective selection switches fully OFF so that the WiFi power amplifier operates to filter harmonics from the additional output.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, in integrated radio-frequency front-end circuitry, a receiver and at least one transmitter share a connection to an external load, such as an input/output pad to an antenna. For example, certain types of radio-frequency communications devices include a receiver as well as a transmitter (e.g., a WiFi transmitter). In some cases there is a second transmitter (e.g., when the first transmitter is a WiFi transmitter, the second transmitter may be a BLUETOOTH® transmitter). The last stage of each transmitter includes a power amplifier. The presence of the power amplifier of the first transmitter, even when not in use, can degrade the output of the receiver or the second transmitter.

For purposes of this discussion, one may consider implementations where the first transmitter is a WiFi transmitter and the second transmitter is a BLUETOOTH® transmitter. However, it is noted that the subject matter of the present disclosure applies to other implementations involving first and second transmitters, each corresponding to different radio technologies, regardless of the particular types of radio technologies involved.

In implementations where the first transmitter is a WiFi transmitter and the second transmitter is a BLUETOOTH® transmitter, the receiver typically includes a low-noise amplifier (LNA). The power amplifier of the WiFi transmitter, which may be modeled as a resonant RLC circuit, has its resonant frequency at the frequency of operation, which also is the frequency of operation of the LNA. Even though the transmitter portions of the circuitry are nominally disconnected from the input/output pad in receive mode, the switch that controls that connection or disconnection is a semiconductor device that is relatively large because of its power requirements, thus resulting in relatively large capacitance. Such devices are not true open circuits even when turned OFF, especially at higher frequencies. Therefore, in the receive mode, the WiFi power amplifier adds loading to the LNA, which degrades the signal-to-noise ratio of the LNA (the degradation may be expressed, e.g., as a noise factor or noise figure).

If a BLUETOOTH® transmitter also is present, the WiFi power amplifier continues to add loading to the LNA in receive mode. Moreover, in BLUETOOTH® transmit mode the presence of the WiFi power amplifier results in high insertion loss at the output of the BLUETOOTH® power amplifier.

In accordance with implementations of the subject matter of this disclosure, the foregoing undesirable effects are mitigated by providing a facility for controllably detuning the power amplifier of the first transmitter—i.e., the WiFi power amplifier—during receive mode. Moving the resonant frequency of the WiFi power amplifier away from the receiver operating frequency increases the impedance of the WiFi power amplifier at the receiver operating frequency, thereby reducing the loading on the receiver low-noise amplifier. By reducing loading on the receiver low-noise amplifier, the noise figure at the receiver low-noise amplifier is reduced (i.e., the signal-to-noise ratio is improved).

The WiFi power amplifier is coupled to the input/output pad through a balun or matching transformer and thus may be modeled as a capacitance in parallel with an inductance and a resistance (i.e., a parallel RLC circuit). The resonant frequency of that RLC circuit is around the operating frequency of the WiFi transmitter and the receiver.

In accordance with implementations of the subject matter of this disclosure, an impedance element is controllably coupled between ground and the output of the WiFi power amplifier. When the WiFi power amplifier is not in use—e.g., in receive mode—the impedance element is switched into the circuitry, detuning the WiFi power amplifier, so that the resonant frequency of the WiFi power amplifier becomes a frequency sufficiently far from the operating frequency of the receiver LNA that the presence of the WiFi power amplifier does not significantly load the LNA and thus does not degrade the noise figure of the LNA.

The impedance element may be a capacitor. The impedance element also may be an inductor, but in an integrated circuit implementation, inductors are much larger and lossier than capacitors, so capacitors are more likely to be used. The WiFi power amplifier may have a single-ended output, in which case there may be a single capacitor between the WiFi power amplifier output and ground. However, a differential signal (i.e., two signals of opposite polarities) is favored because a differential signal is less noisy, in which case a separate capacitor is provided between ground and each pole of the differential signal. In some embodiments, the two capacitors have the same magnitude. The value of the capacitor (or each of the capacitors) should be substantially the same as, and in some embodiments the same as, the capacitance of the RLC circuit with which the WiFi power amplifier may be modeled (see above). If the capacitance values are different from each other, or are different from the value of the capacitance of the RLC circuit, the resonant frequency will still shift, but the shift may not be as far as when the respective capacitances are the same or substantially the same. In such a case, the desired improvement in noise performance may not be realized.

When the WiFi power amplifier is in use—e.g., in WiFi transmit mode—the impedance element (e.g., capacitor) or impedance elements (e.g., capacitors) are switched out of the circuitry, causing the WiFi power amplifier to operate as intended. In transmit mode, the LNA (or any other receive amplifier) is controllably removed from the circuitry by, e.g., closing a switch that connects the input of the LNA to ground.

The switches referred to in this discussion are semiconductor devices (e.g., transistors). Therefore, they do not have binary fully-ON and fully-OFF states. Rather, depending on a gate voltage, any such switch can be very strongly ON or very strongly OFF, but even in the very strongly OFF state, some current may flow. Indeed, that is the reason that the WiFi power amplifier cannot be simply disconnected from the receive amplifier in receive mode. A semiconductor switch is provided to disconnect the WiFi power amplifier from the receive amplifier, but even when very strongly OFF, that semiconductor switch allows some signal from the WiFi power amplifier to reach the receive amplifier (e.g., due to leakage).

Moreover, any semiconductor switch may be less strongly ON or OFF, or "partially-ON," allowing varying amounts of current to flow. In some implementations, the partially-ON state is used to tune the circuitry. Thus, when the WiFi power amplifier is operating (e.g., in transmit mode), the impedance element (e.g., capacitor) or impedance elements (e.g., capacitors) may be more or less strongly turned ON to tune the WiFi power amplifier to a particular desired frequency within a band of frequencies.

Some implementations include a second transmitter, such as a BLUETOOTH® transmitter. In one such implementation, the output of the BLUETOOTH® transmitter power amplifier is coupled to the input/output pad through a winding of the output balun or transformer of the WiFi transmitter power amplifier. A semiconductor switch is provided between the output of the BLUETOOTH® transmitter power amplifier and ground, and closing that switch—i.e., turning it strongly ON—effectively removes the BLUETOOTH® transmitter power amplifier from the circuitry.

In such an implementation, the receive mode operates similarly to the implementation that lacks the second transmitter. Thus, the first transmit switch, which disconnects the output of the WiFi power amplifier, and therefore also the output of the BLUETOOTH® power amplifier, from the input/output pad is strongly OFF. In addition, the switch between ground and the output of the BLUETOOTH® power amplifier is strongly ON, effectively removing the BLUETOOTH® power amplifier from the circuitry. In addition, the switches connecting, to ground, the capacitor or capacitors coupled to the output, or to the differential output components, of the WiFi power amplifier, also are strongly ON, controllably detuning the WiFi power amplifier to the maximum extent, to minimize the effect on the receiver LNA of any signal conducted through the first transmit switch even when the first transmit switch is OFF.

In the first-transmitter transmit mode (i.e., WiFi transmit mode) of this implementation, the first transmit switch is strongly ON so that the output of the WiFi power amplifier is connected to the input/output pad. The second transmit switch, which connects the output of the second transmitter (i.e., the output of the BLUETOOTH® transmitter power amplifier) to ground, also is strongly ON, so that the BLUETOOTH® transmitter is effectively removed from the circuitry. Similarly, the switch that connects the input of the receiver LNA to ground also is strongly ON, so that the receiver LNA is effectively removed from the circuitry. Finally, the switch or switches that control the connection, to ground, of the capacitor or capacitors coupled to the output, or to the differential output components, of the WiFi power amplifier, may be partially ON. The degree to which the gate voltage is applied to turn those switches are ON is determined by the degree to which it is desired to tune the WiFi power amplifier to a frequency other than its default frequency. Those switches may therefore be referred to as band-select switches.

In the second-transmitter transmit mode (i.e., BLUETOOTH® transmit mode), the first transmit switch again is strongly ON so that the output of the WiFi power amplifier is connected to the input/output pad, and again the switch that connects the input of the receiver LNA to ground also is strongly ON, so that the receiver LNA is effectively removed from the circuitry. The second transmit switch, which connects the output of the second transmitter (i.e., the output of the BLUETOOTH® power amplifier) to ground, also is strongly OFF, so that the BLUETOOTH® transmitter operates as intended.

Finally, the band-select switches are fully OFF so that the WiFi power amplifier resonates at its default operating frequency, which is close to the second harmonic of the output signal of the BLUETOOTH® transmitter power amplifier (i.e., 5-6 GHz). Because the second transmitter (i.e., the BLUETOOTH® transmitter) is coupled to the output through a winding of the WiFi output balun or matching transformer, the WiFi power amplifier, resonating close to the second harmonic of the output signal of the BLUETOOTH® transmitter power amplifier, will reduce the insertion loss (at 2.4 GHz) at the output of the second transmitter (i.e., the BLUETOOTH® transmitter).

Moreover, the WiFi operating frequency, and therefore the resonant frequency of the WiFi power amplifier circuitry, is in the 5-6 GHz range. The BLUETOOTH® power amplifier circuitry operating frequency is 2.4 GHz, meaning that its second and third harmonics are at 4.8 GHz and 7.2 GHz, respectively, both of which are close to the resonant frequency of the WiFi amplifier circuitry. Therefore, the WiFi power amplifier, resonating at its default operating frequency, will present a high impedance to—i.e., will filter out—the undesirable second and third harmonics of the BLUETOOTH® power amplifier. Thus the same effect that reduces the BLUETOOTH® power amplifier insertion loss also reduces the undesirable second and third harmonics of the BLUETOOTH® power amplifier.

Implementations of the subject matter of the present disclosure will be better understood by reference to FIGS. 1-7.

Figure 1:
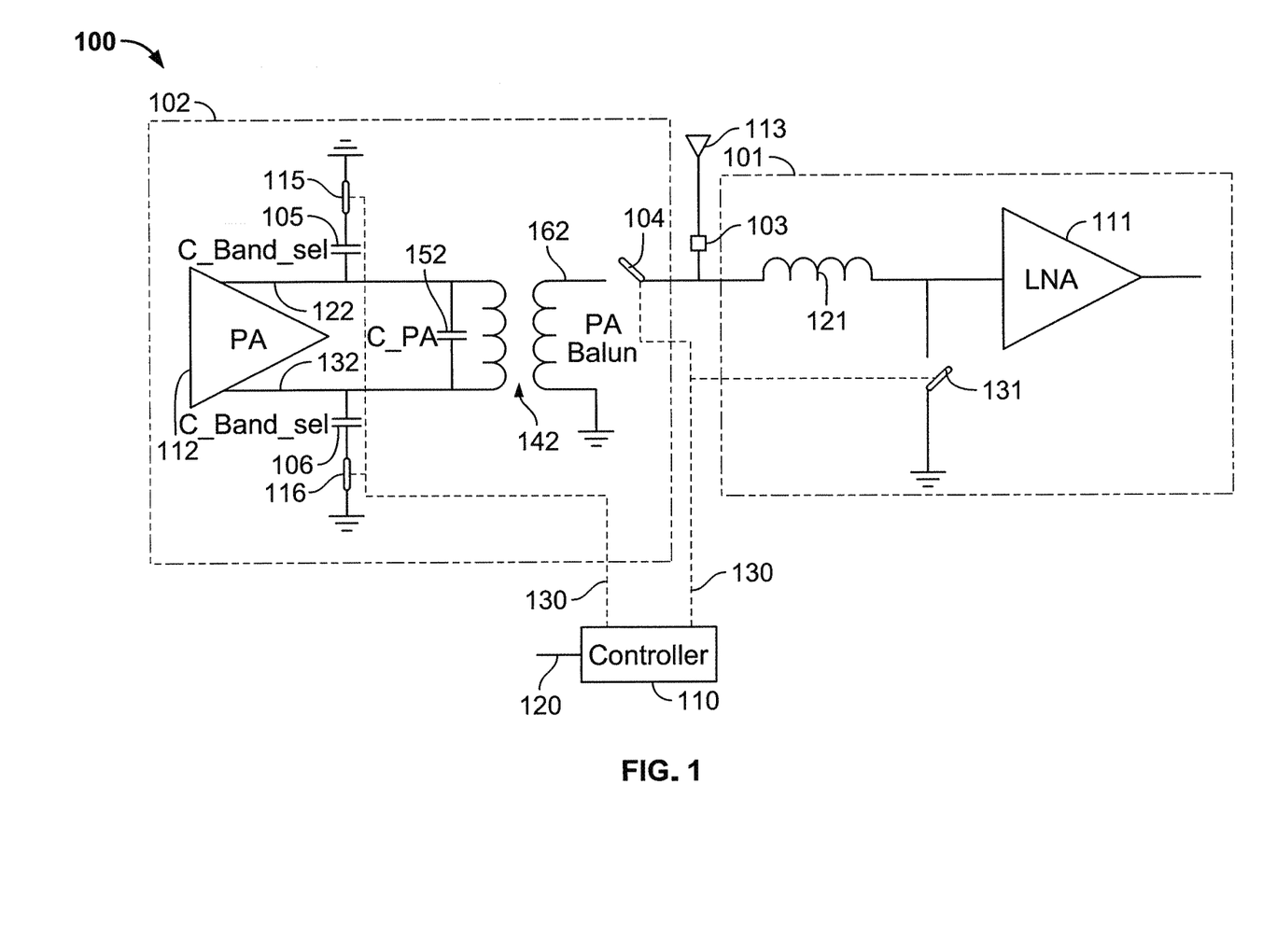
FIG. 1 is a schematic representation of a first implementation of the subject matter of the present disclosure in a receive mode.
Figure 2:
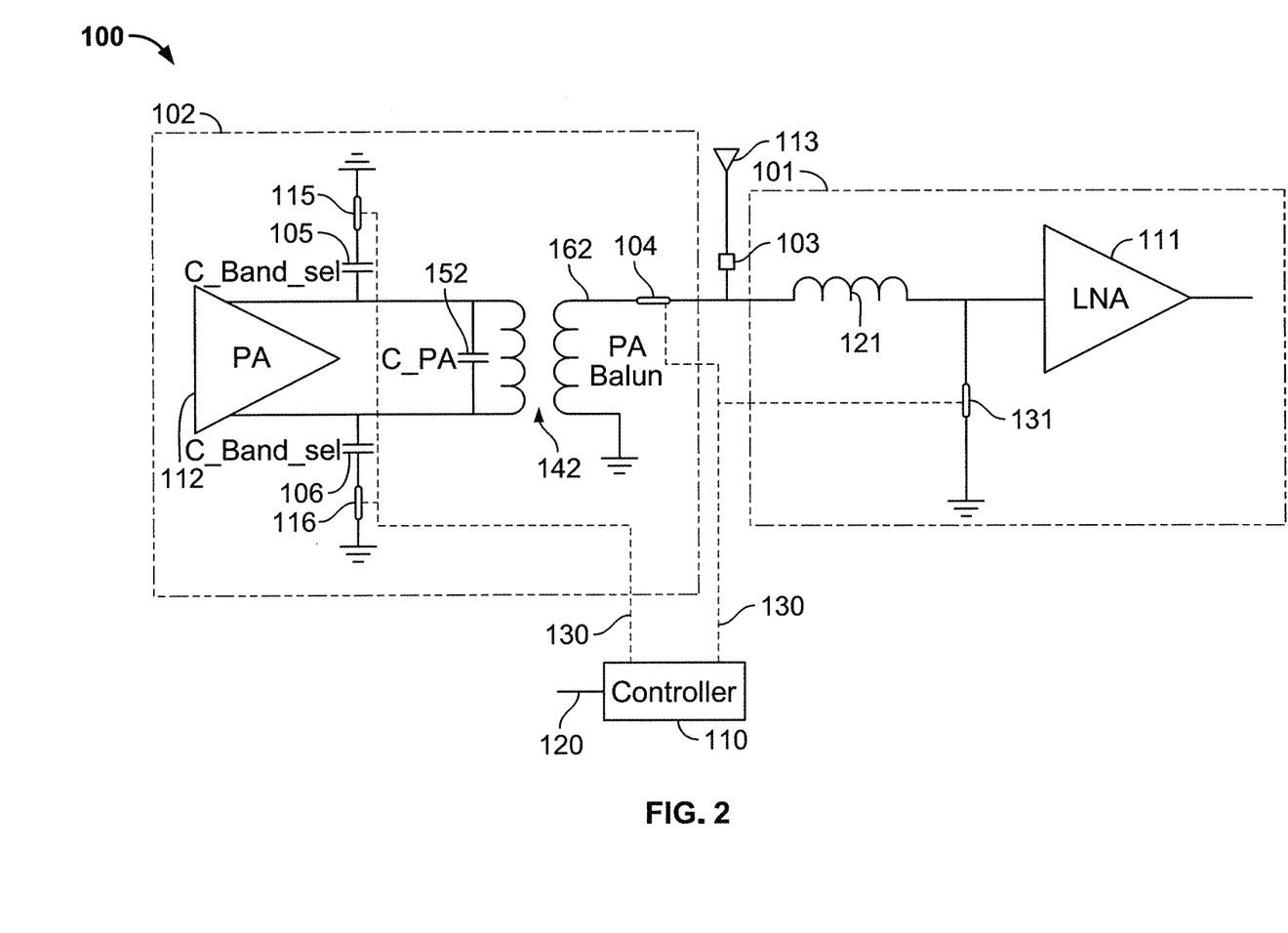
FIG. 2 is a schematic representation of the implementation of FIG. 1 in a transmit mode.

FIGS. 1 and 2 are schematic representations of a transceiver 100 implementing the subject matter of the present disclosure including a receiver and a single transmitter such as a WiFi transmitter. In FIG. 1, transceiver 100 is configured for the receive mode. In this representation only the respective receive and transmit amplifiers are shown in the respective receiver portion 101 and transmitter portion 102, but it is noted that receiver portion 101 and transmitter portion 102 may include additional circuitry.

The receive amplifier is a low-noise amplifier 111, whose input is coupled to input/output pad 103 and antenna (or other load) 113 via inductor 121. Receiver bypass switch 131 controllably connects the input of low-noise amplifier 111 to ground to turn off low-noise amplifier 111 when desired.

The transmit amplifier is a WiFi power amplifier 112 having a differential output on conductors 122, 132, connected to input/output pad 103 via balun or matching transformer 142.

Balun 142 has an impedance that may be modeled as a capacitance 152 (C_PA). Output 162 of balun 142 is connected to input/output pad 103 via transmitter RF switch 104. Each leg 122, 132 of the differential output is switchably connected to ground via respective band-select capacitors (C_band_select) 105, 106 under control of respective band-select switches 115, 116.

As discussed above, each of switches 104, 115, 116, 131 is a semiconductor switch (e.g., a transistor). As such, each of switches 104, 115, 116, 131 is never actually completely ON or completely OFF. In particular, when nominally OFF, each of switches 104, 115, 116, 131 may pass some current, particularly at higher frequencies. Because of its high power requirements, transmitter RF switch 104 has a large device area and is particularly susceptible to such leakage.

As noted, FIG. 1 shows transceiver 100 configured for the receive mode. Thus, receiver bypass switch 131 is OFF (while the configuration of switch 131 is depicted as "open," as a semiconductor device, switch 131 is not physically open) to keep low-noise amplifier 111 in the circuitry, while transmitter RF switch 104 also is OFF to disconnect WiFi power amplifier 112 from the circuitry. However, as previously discussed, transmitter RF switch 104 is not completely "closed" when OFF, allowing WiFi power amplifier 112 to contribute to loading of low-noise amplifier 111 and potentially degrading the noise figure of low-noise amplifier 111.

Therefore, in this configuration, band-select switches 115, 116 are also fully ON to detune WiFi power amplifier 112 away from its normal operating frequency. By making the values of band-select capacitors (C_band_select) 105, 106 the same, or substantially the same, as the capacitance C_PA of balun 142, the resonant frequency of WiFi power amplifier 112, which is inversely proportional to the square root of the product of the inductance and capacitance of balun 142, can reduced by about 25%. With a detuned resonant frequency far from the operating frequency of low-noise amplifier 111, WiFi power amplifier 112 no longer causes significant loading of low-noise amplifier 111, which improves the noise figure of low-noise amplifier 111.

FIG. 2 is a schematic representation of transceiver 100 configured for the transmit mode. In the transmit mode, receiver bypass switch 131 is ON (again, while the configuration of switch 131 is depicted as "closed," as a semiconductor device, switch 131 is not physically closed) to effectively take low-noise amplifier 111 out of the circuitry by shorting its input to ground. Transmitter RF switch 104 is ON to connect WiFi power amplifier 112, via balun 142, to input/output pad 103.

In this configuration, the states of band-select switches 115, 116, although depicted as closed, or ON, are indeterminate. Consistent with their name, as discussed above, band-select switches 115, 116 are used to tune WiFi power amplifier 112 to a desired frequency other than its natural resonant frequency, by adding all or part of the capacitances of band-select capacitors (C_band_select) 105, 106. When band-select switches 115, 116 are as strongly ON as possible, band-select capacitors (C_band_select) 105, 106 make the greatest possible contribution and the frequency to which WiFi power amplifier 112 is tuned is the furthest frequency from the natural resonant frequency that is available in this implementation. When band-select switches 115, 116 are less strongly ON, band-select capacitors (C_band_select) 105, 106 make less of a contribution, and the frequency to which WiFi power amplifier 112 is tuned is somewhere between that furthest available frequency and the natural resonant frequency.

Figure 3:
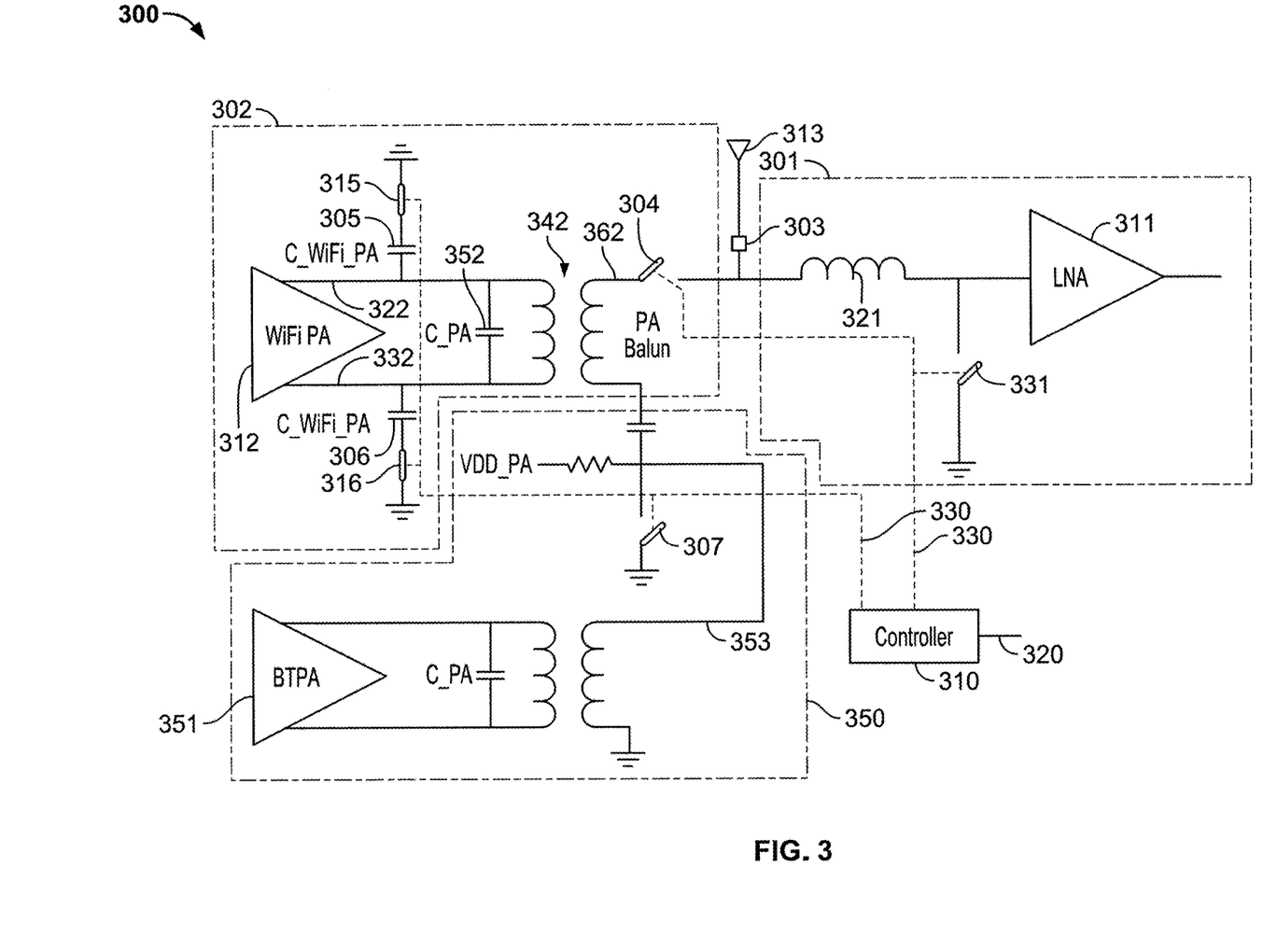
FIG. 3 is a schematic representation of a second implementation of the subject matter of the present disclosure in a receive mode.
Figure 4:
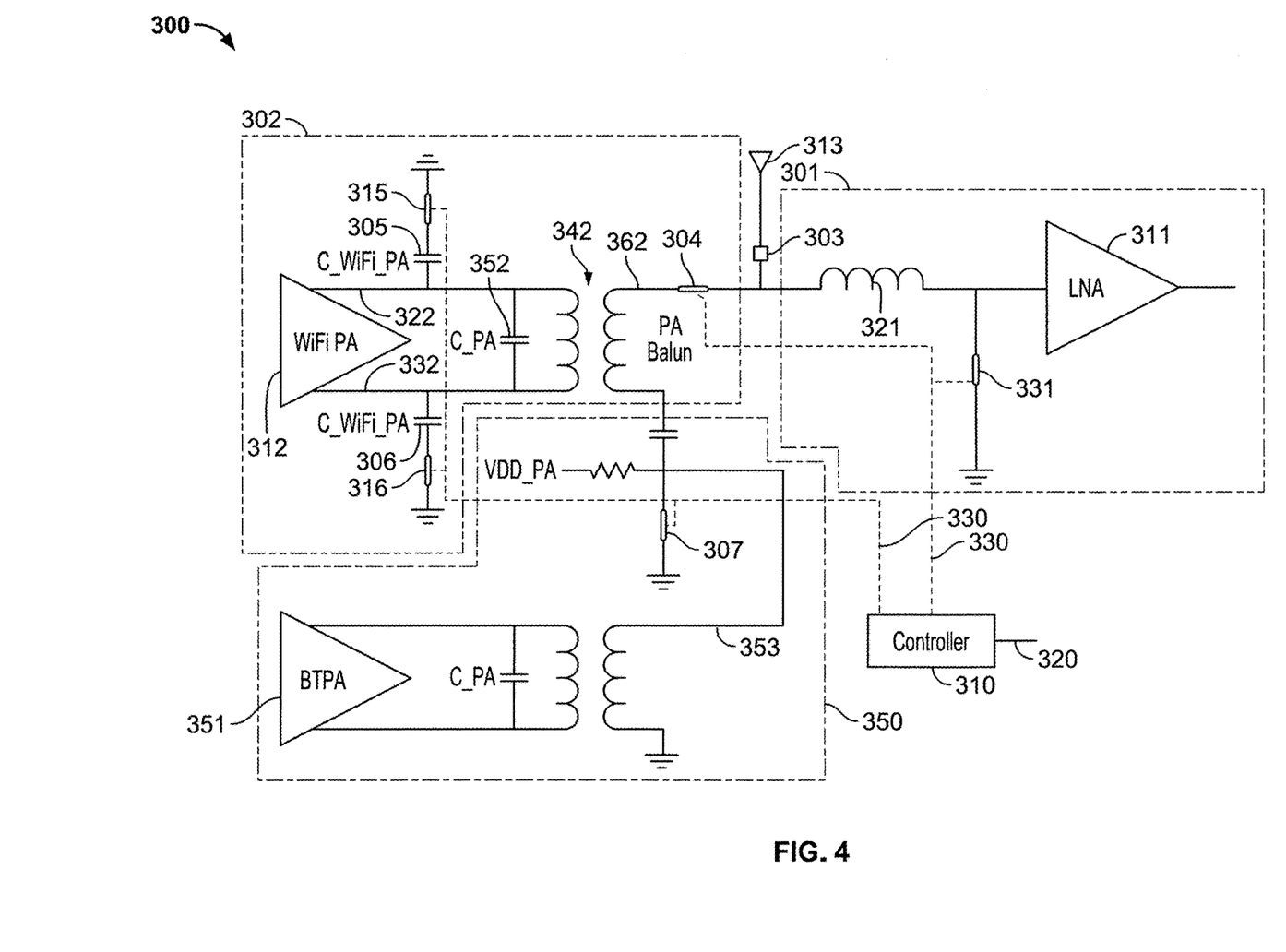
FIG. 4 is a schematic representation of the implementation of FIG. 3 in a first transmit mode.
Figure 5:
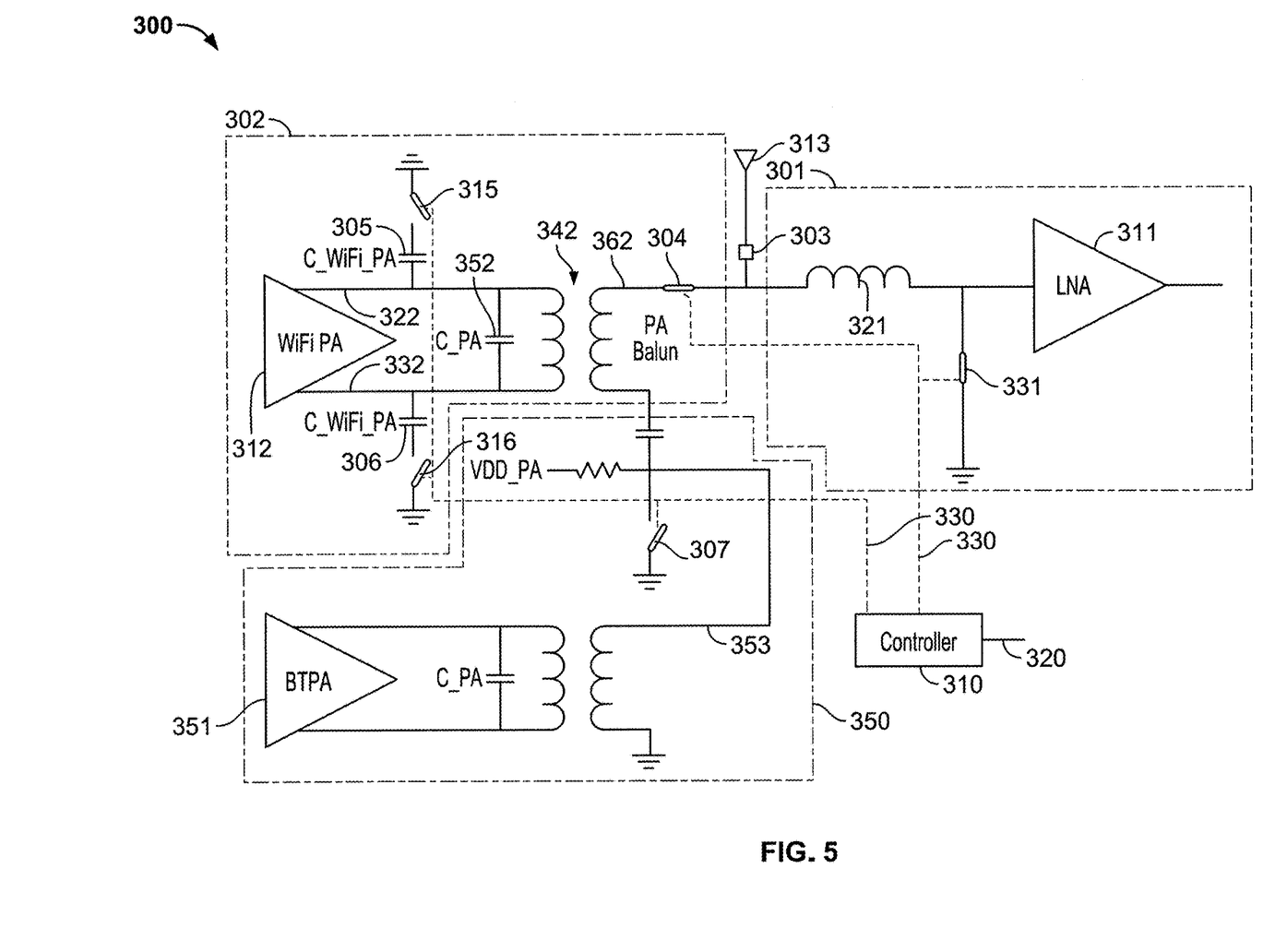
FIG. 5 is a schematic representation of the implementation of FIGS. 3 and 4 in a second transmit mode.

FIGS. 3-5 are schematic representations of a transceiver 300 implementing the subject matter of the present disclosure including a receiver and two transmitters, such as a WiFi transmitter and a BLUETOOTH® transmitter. In this representation only the receive amplifier and each of the two transmit amplifiers are shown, respectively, in receiver portion 301, first, WiFi, transmitter portion 302, and second, BLUETOOTH®, transmitter portion 350, but it is again noted that receiver portion 301 and transmitter portions 302, 350 may include additional circuitry. In FIG. 3, transceiver 300 is configured for the receive mode.

The receive amplifier is a low-noise amplifier 311, whose input is coupled to input/output pad 303 and antenna (or other load) 313 via inductor 321. Receiver bypass switch 331 controllably connects the input of low-noise amplifier 311 to ground to turn off low-noise amplifier 311 when desired.

The transmit amplifier is a WiFi power amplifier 312 having a differential output on conductors 322, 332, connected to input/output pad 303 via balun or matching transformer 342. Balun 342 has an impedance that may be modeled as a capacitance 352 (C_PA). Output 362 of balun 342 is connected to input/output pad 303 via transmitter RF switch 304. Each leg 322, 332 of the differential output is switchably connected to ground via respective band-select capacitors (C_band_select) 305, 306 under control of respective band-select switches 315, 316.

As noted, FIG. 3 shows transceiver 300 configured for the receive mode. Thus, receiver bypass switch 331 is OFF (while the configuration of switch 331 is depicted as "open," as a semiconductor device, switch 331 is not physically open) to keep low-noise amplifier 311 in the circuitry, while transmitter RF switch 304 also is OFF to disconnect WiFi power amplifier 312 and second, BLUETOOTH®, power amplifier 351 from the circuitry. The state of second transmit switch 307 (a BLUETOOTH® transmitter bypass switch), which determines whether BLUETOOTH® power amplifier 351 is effectively in the circuitry or not, does not matter in this configuration, because transmitter RF switch 304 is OFF. However, as previously discussed, transmitter RF switch 304 is not completely "closed" when OFF, allowing WiFi power amplifier 312 to contribute to loading of low-noise amplifier 311 and potentially degrading the noise figure of low-noise amplifier 311.

Therefore, in this configuration, band-select switches 315, 316 are also fully ON to detune WiFi power amplifier 312 away from its normal operating frequency. By making the values of band-select capacitors (C_band_select) 305, 306 the same, or substantially the same, as the capacitance C_PA of balun 342, the resonant frequency of WiFi power amplifier 312 can reduced by 25%. With a detuned resonant frequency of WiFi power amplifier 312 far from the operating frequency of low-noise amplifier 311, WiFi power amplifier 312 no longer causes significant loading of low-noise amplifier 311, which improves the noise figure of low-noise amplifier 311.

FIG. 4 is a schematic representation of transceiver 300 configured for the first transmit mode (e.g., WiFi transmit mode). In the WiFi transmit mode, receiver bypass switch 331 is ON (again, while the configuration of switch 331 is depicted as "closed," as a semiconductor device, switch 331 is not physically closed) to effectively take low-noise amplifier 311 out of the circuitry by shorting its input to ground. Similarly, second transmit switch 307 is ON to effectively take BLUETOOTH® power amplifier 351 out of the circuitry by shorting its output to ground. Transmitter RF switch 304 is ON to connect WiFi power amplifier 312, via balun 342, to input/output pad 303.

In this configuration, the states of band-select switches 315, 316 are indeterminate. Consistent with their name, as discussed above, band-select switches 315, 316 are used to tune WiFi power amplifier 312 to a desired frequency other than its natural resonant frequency, by adding all or part of the capacitances of band-select capacitors (C_band_select) 305, 306. When band-select switches 315, 316 are as strongly ON as possible, band-select capacitors (C_band_select) 305, 306 make the greatest possible contribution and the frequency to which WiFi power amplifier 312 is tuned is the furthest frequency from the natural resonant frequency that is available in this implementation. When band-select switches 315, 316 are less strongly ON, band-select capacitors (C_band_select) 305, 306 make less of a contribution, and the frequency to which WiFi power amplifier 312 is tuned is somewhere between that furthest available frequency and the natural resonant frequency.

FIG. 5 is a schematic representation of transceiver 300 configured for the second transmit mode (e.g., BLUETOOTH® transmit mode). In the BLUETOOTH® transmit mode, receiver bypass switch 331 is ON (again, while the configuration of switch 331 is depicted as "closed," as a semiconductor device, switch 331 is not physically closed) to effectively take low-noise amplifier 311 out of the circuitry by shorting its input to ground. Transmitter RF switch 304 is ON to connect the output of BLUETOOTH® power amplifier 351, via one of the windings of balun 342, to input/output pad 303. In this configuration, second transmit switch 307 is OFF to keep second transmit power amplifier 351 in the circuitry.

In this configuration, band-select switches 315, 316 are as strongly OFF as possible so that WiFi power amplifier 312 resonates at its natural frequency. The resonance of WiFi power amplifier 312 at its natural frequency has two beneficial effects in the BLUETOOTH® transmit configuration. First, the resonance of WiFi power amplifier 312 reduces insertion loss at output 353 of BLUETOOTH® power amplifier 351. Second, the resonance of WiFi power amplifier 312 creates a low impedance in WiFi power amplifier 312 to the second and third harmonics of BLUETOOTH® power amplifier 351, allowing WiFi power amplifier 312 to filter out those harmonics, which are undesirable.

In any of the foregoing, or other, implementations, a suitable controller 110/310 is provided to send signals 130/330 to set the various semiconductor switches according to selection inputs 120/320 provided by a user, or by other processes in a larger device of which the transceiver is a part.

Figure 6:
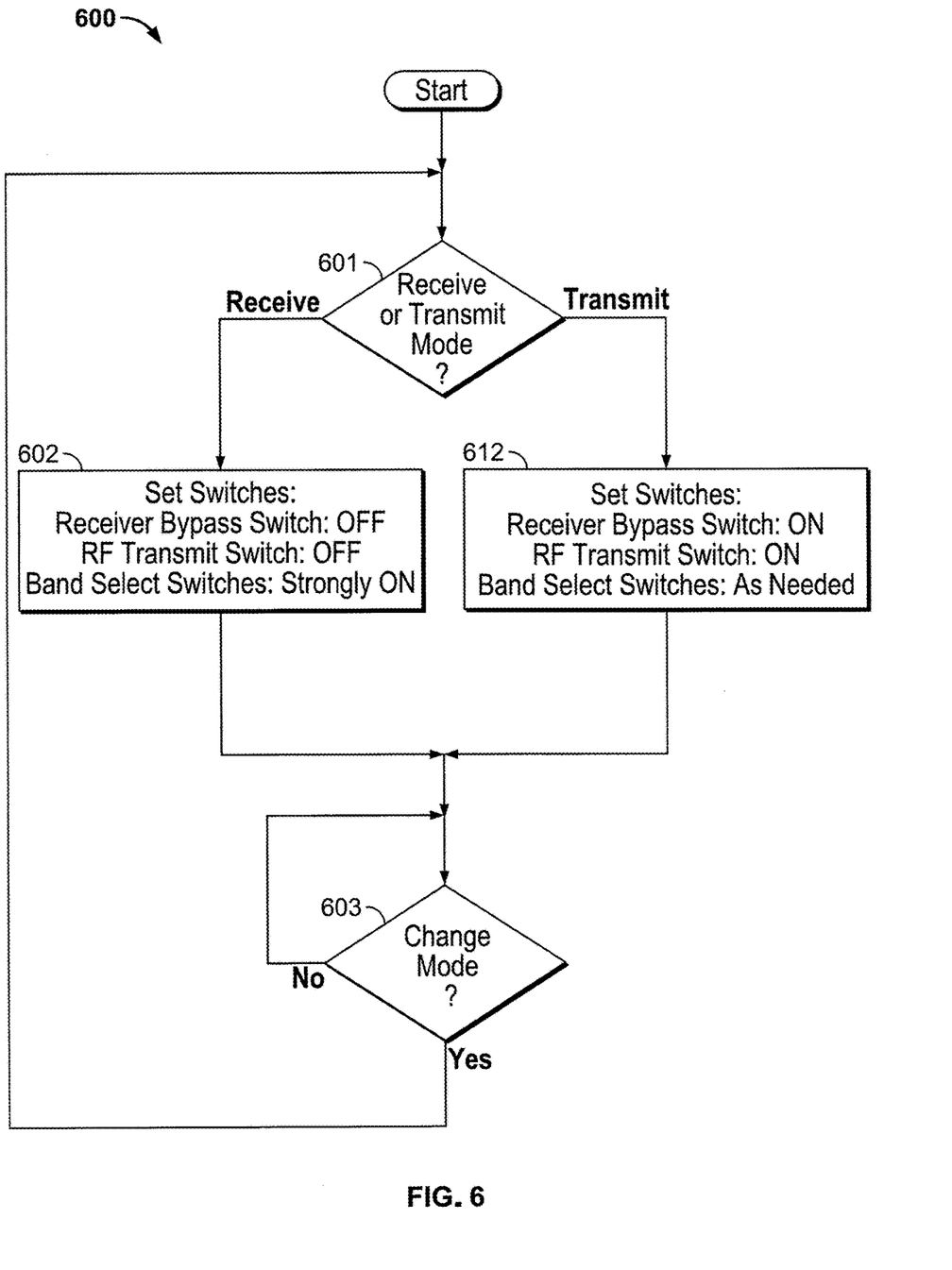
FIG. 6 is a flow diagram representing a method of operation of the implementation of FIGS. 1 and 2.

FIG. 6 is a flow diagram of a method 600 of operating the transceiver of FIGS. 1 and 2, which can operate in a WiFi receive mode or a WiFi transmit mode.

At 601, it is determined whether receive mode or transmit mode is desired. If receive mode is desired, then at 602, the receiver bypass switch 131 is turned OFF (keeping LNA 111 in the circuit), the transmitter RF switch 104 is turned OFF (disconnecting transmitter output from input/output pad 103), and band select switches 115, 116 are turned strongly ON (detuning WiFi power amplifier 112). If at 601 it is determined that transmit mode is desired, then at 612, the receiver bypass switch 131 is turned ON (removing LNA 111 from the circuit), the transmitter RF switch 104 is turned ON (connecting transmitter output to input/output pad 103), and band select switches 115, 116 are turned ON to the extent needed to tune WiFi power amplifier 112 to a desired frequency. After 602 or 612, at 603, a request to change modes is awaited. When a request to change modes is received, flow returns to 601 to determine what mode is desired.

Figure 7:
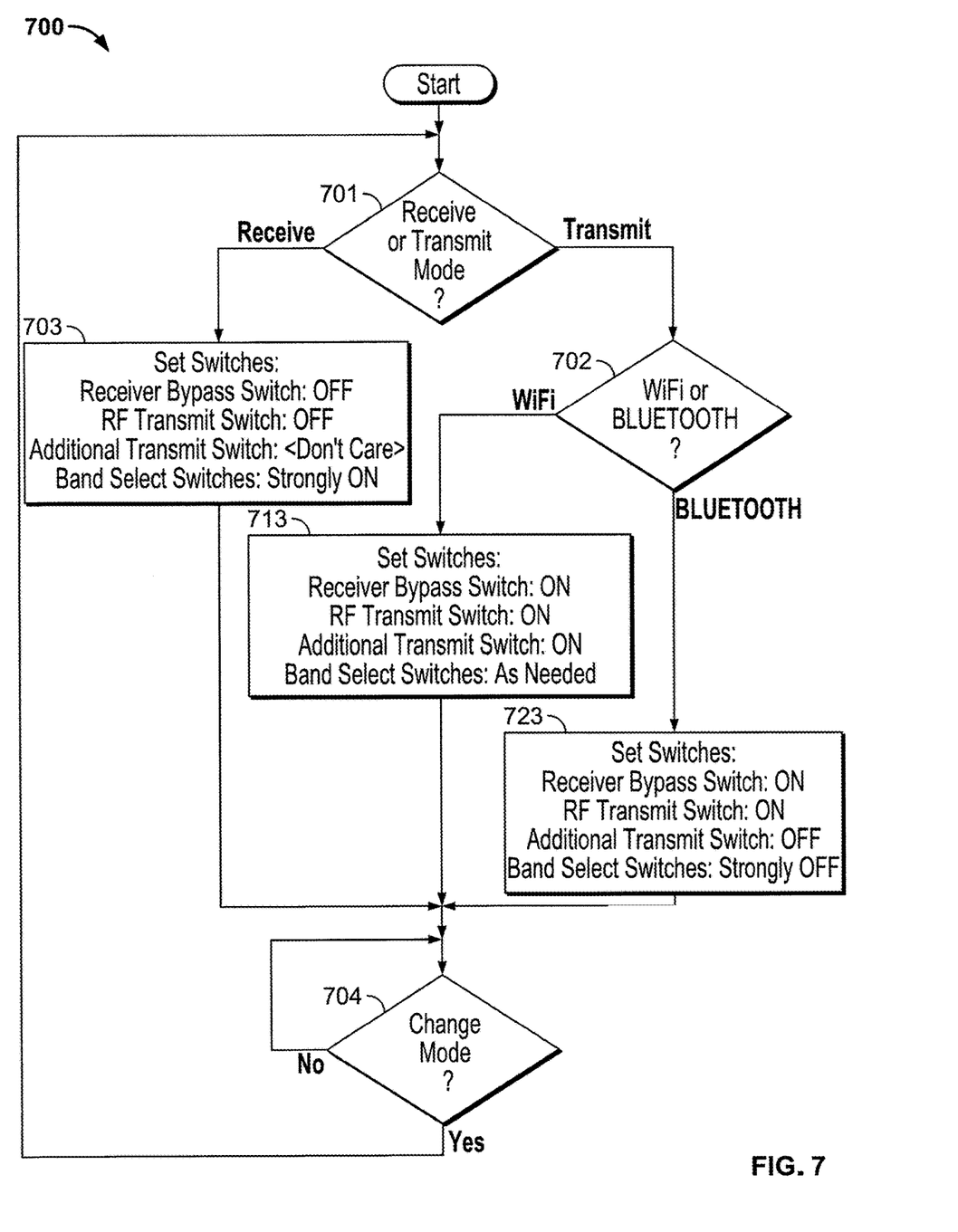
FIG. 7 is a flow diagram representing a method of operation of the implementation of FIGS. 3-5.

FIG. 7 is a flow diagram of a method 700 of operating the transceiver of FIGS. 3-5, which can operate in a receive mode or a WiFi or BLUETOOTH® transmit mode.

At 701, it is determined whether receive mode or transmit mode is desired. If receive mode is desired, then at 703, the receiver bypass switch 331 is turned OFF (keeping LNA 311 in the circuit), the transmitter RF switch 304 is turned OFF (disconnecting transmitter output from input/output pad 303), and band select switches 315, 316 are turned strongly ON (detuning WiFi power amplifier 312). The state of additional (BLUETOOTH® bypass) transmit switch 307 is unimportant (because transmitter RF switch 304 is turned OFF). If at 701 it is determined that transmit mode is desired, then at 702 it is determined whether transmission will be in WiFi mode or BLUETOOTH® mode.

If at 702 it is determined that transmission will be in WiFi mode, then at 713, the receiver bypass switch 331 is turned ON (removing LNA 311 from the circuit), the transmitter RF switch 304 is turned ON (connecting transmitter output to input/output pad 303), the additional (BLUETOOTH® bypass) transmit switch 307 is turned ON (removing BLUETOOTH® power amplifier 351 from the circuit), and band select switches 315, 316 are turned ON to the extent needed to tune WiFi power amplifier 312 to a desired frequency. If at 702 it is determined that transmission will be in BLUETOOTH® mode, then at 723, the receiver bypass switch 331 is turned ON (removing LNA 311 from the circuit), the transmitter RF switch 304 is turned ON (connecting transmitter output to input/output pad 303), the additional (BLUETOOTH® bypass) transmit switch 307 is turned OFF removing BLUETOOTH® power amplifier 351 from the circuit), and band select switches 315, 316 are turned strongly OFF (keeping WiFi power amplifier 312 fully in the circuit to act as filter).

After 703, 713 or 723, then at 704, a request to change modes is awaited. When a request to change modes is received, flow returns to 701 to determine what mode is desired.

Thus it is seen that a transceiver that can operate in one of transmit mode or receive mode, without degradation of the other mode, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of operating radio-frequency front-end circuitry, having an output terminal, a receive amplifier controllably coupled to the output terminal, and at least one transmit amplifier controllably inductively coupled to the output terminal, the one of the at least one transmit amplifier having a resonant frequency, the method comprising:

during receive mode:
switching at least one impedance element, having a first impedance value, into the radio-frequency front-end circuitry between ground and one of the at least one transmit amplifier to reduce degradation of output of the receive amplifier by changing the resonant frequency of the one of the at least one transmit amplifier to reduce noise at the receive amplifier; and during transmit mode:
switching the at least one impedance element at least partially out of the radio-frequency front-end circuitry.

2. The method of claim 1, further comprising controllably inductively coupling output of the one of the at least one transmit amplifier to the output terminal through a balun having a second impedance value.

3. The method of claim 2 wherein the switching at least one impedance element, having the first impedance value, into the radio-frequency front-end circuitry between ground and one of the at least one transmit amplifier comprises switching, into the radio-frequency front-end circuitry, an impedance element of which the first impedance value is substantially equal to the second impedance value.

4. The method of claim 3 wherein the switching at least one impedance element, having the first impedance value, into the radio-frequency front-end circuitry between ground and one of the at least one transmit amplifier comprises switching, into the radio-frequency front-end circuitry, the impedance element of which the first impedance value is equal to the second impedance value.

5. The method of claim 2, the one of the at least one transmit amplifier using differential signaling, having a first differential signal component with a first polarity and a second differential component with a second polarity opposite the first polarity; wherein:

the switching at least one impedance element, having a first impedance value, into the radio-frequency front-end circuitry between ground and one of the at least one transmit amplifier comprises switching, into the radio-frequency front-end circuitry, two impedance elements, each having the first impedance value which is substantially equal to the second impedance value, including switching a first one of the two impedance elements into the radio-frequency front-end circuitry between the first differential signal component and ground, and switching a second one of the two impedance elements into the radio-frequency front-end circuitry between the second differential signal component and ground.

6. The method of claim 5 wherein the switching, into the radio-frequency front-end circuitry, the two impedance elements, each having the first impedance value which is substantially equal to the second impedance value, comprises switching into the radio-frequency front-end circuitry, the two impedance elements, each having the first impedance value which is equal to the second impedance value.

7. The method of claim 2, the at least one transmit amplifier including a second transmit amplifier that generates second transmit signals and harmonics of the second transmit signals and being controllably inductively connected to the output of the one of the at least one transmit amplifier; the method further comprising filtering output of the second transmit amplifier by:
controllably inductively connecting the output of the second transmit amplifier to the output of the one of the at least one transmit amplifier, and
switching the at least one impedance element out of the radio-frequency front-end circuitry so that the one of the at least one transmit amplifier acts as a filter of the output of the second transmit amplifier.

8. Radio-frequency front-end circuitry comprising:
an output terminal;
a receive amplifier controllably coupled to the output terminal;
at least one transmit amplifier controllably inductively coupled to the output terminal, and having a resonant frequency;
at least one impedance element having a first impedance value and being controllably coupled between ground and one of the at least one transmit amplifier to reduce degradation of output of the radio-frequency front-end circuitry, when the one of the at least one transmit amplifier is not in use, by changing the resonant frequency of the one of the at least one transmit amplifier to reduce noise at the receive amplifier; and
control circuitry that actuates the controllable coupling of the receive amplifier to the output terminal, the controllable coupling of the transmit amplifier to the output terminal, and the controllable coupling of the at least one impedance element between ground and the one of the at least one transmit amplifier.

9. The radio-frequency front-end circuitry of claim 8 wherein:
output of the one of the at least one transmit amplifier is coupled to the output terminal through a balun having a second impedance value.

10. The radio-frequency front-end circuitry of claim 9 wherein the first impedance value is substantially equal to the second impedance value.

11. The radio-frequency front-end circuitry of claim 10 wherein the first impedance value is equal to the second impedance value.

12. The radio-frequency front-end circuitry of claim 9 wherein:
the one of the at least one transmit amplifier uses differential signaling, having a first differential signal component with a first polarity and a second differential signal component with a second polarity opposite the first polarity;
the at least one impedance element comprises two impedance elements, each having the first impedance value;
a first one of the two impedance elements is controllably coupled between the first differential signal component and ground;
a second one of the two impedance elements is controllably coupled between the second differential signal component and ground; and
the first impedance value is substantially equal to the second impedance value.

13. The radio-frequency front-end circuitry of claim 12 wherein the first impedance value is equal to the second impedance value.

14. The radio-frequency front-end circuitry of claim 9 wherein the one of the at least one transmit amplifier comprises a WiFi power amplifier.

15. The radio-frequency front-end circuitry of claim 14 wherein:
the at least one transmit amplifier further comprises a second transmit amplifier that generates second transmit signals and harmonics of the second transmit signals; and
the second transmit amplifier is switchably connected to the output of the one of the at least one transmit amplifier so that output of the second transmit amplifier is filtered by the one of the at least one transmit amplifier.

16. The radio-frequency front-end circuitry of claim 14 wherein the second transmit amplifier comprises a BLUETOOTH® power amplifier.

17. The radio-frequency front-end circuitry of claim 9 wherein each of the at least one impedance element comprises a capacitor.

18. Combined WiFi/BLUETOOTH® transmitter/receiver front-end circuitry, comprising:
an output terminal;
an antenna coupled to the output terminal;
a low-noise amplifier having an input coupled to the output terminal;
a receiver bypass switch between the input of the low-noise amplifier and ground;
a WiFi power amplifier having a differential output coupled to the output terminal through a balun having a first impedance;
respective first and second selection impedances coupled via respective selection switches between ground and respective conductors of the differential output;
a radio-frequency transmit switch between the balun and the output terminal;
a BLUETOOTH® power amplifier having an additional output coupled to the balun; and
an additional transmit switch between the additional output and ground; wherein:
in a receive mode, the receiver bypass switch and the radio-frequency transmit switch are both open, and the additional transmit switch is closed;
in a WiFi transmit mode, the receiver bypass switch, the radio-frequency transmit switch and the additional transmit switch are all closed, and the respective selection switches are both at most partially ON to tune the WiFi power amplifier to a desired frequency; and
in a BLUETOOTH® transmit mode, the receiver bypass switch and the radio-frequency transmit switch are both closed, the additional transmit switch is open, and the respective selection switches are both open so that the WiFi power amplifier operates to filter harmonics from the additional output.

19. A method of operating combined WiFi/BLUETOOTH® transmitter/receiver front-end circuitry, having an output terminal, an antenna coupled to the output terminal, a low-noise amplifier having an input coupled to the output terminal, a receiver bypass switch between the input of the low-noise amplifier and ground, a WiFi power amplifier having a differential output coupled to the output terminal through a balun having a first impedance, respective first and second selection impedances coupled via respective selection switches between ground and respective conductors of the differential output, a radio-frequency transmit switch between the balun and the output terminal, a BLUETOOTH® power amplifier having an additional output coupled to the balun, and an additional transmit switch between the additional output and ground; the method comprising:

selecting a receive mode by:
opening the receiver bypass switch to keep the low-noise amplifier in the circuitry;
closing the additional transmit switch to remove the BLUETOOTH® power amplifier from the circuitry;
opening the radio-frequency transmit switch to reduce coupling between the WiFi power amplifier and the output terminal; and
turning both of the respective selection switches fully ON to detune the WiFi power amplifier from an operating frequency of the low-noise amplifier.

20. The method of claim 19 further comprising:
selecting a WiFi transmit mode by:
closing the receiver bypass switch to remove the low-noise amplifier from the circuitry;
closing the additional transmit switch to remove the BLUETOOTH® power amplifier from the circuitry;
closing the radio-frequency transmit switch to fully couple the balun of the WiFi power amplifier to the output terminal; and
turning both of the respective selection switches at most partially ON to tune the WiFi power amplifier to a desired frequency.

21. The method of claim 20 further comprising:
selecting a BLUETOOTH® transmit mode by:
closing the receiver bypass switch to remove the low-noise amplifier from the circuitry;
opening the additional transmit switch to keep the BLUETOOTH® power amplifier in the circuitry;
closing the radio-frequency transmit switch to fully couple the additional output of the BLUETOOTH® power amplifier to the output terminal through the balun; and
turning both of the respective selection switches fully OFF so that the WiFi power amplifier operates to filter harmonics from the additional output.

* * * * *